(12) United States Patent
Scanzillo et al.

(10) Patent No.: US 12,009,649 B2
(45) Date of Patent: Jun. 11, 2024

(54) FLOOR BOX AND METHOD OF INSTALLING

(71) Applicant: Hubbell Incorporated, Shelton, CT (US)

(72) Inventors: Thomas L. Scanzillo, Monroe, CT (US); Michael J. Marchetti, Bridgeport, CT (US); Christopher A. Carbone, Newton, CT (US); Ryan G. Papageorge, Shelton, CT (US)

(73) Assignee: Hubbell Incorporated, Shelton, CT (US)

( * ) Notice: Subject to any disclaimer, the term of this patent is extended or adjusted under 35 U.S.C. 154(b) by 0 days.

(21) Appl. No.: 18/353,204

(22) Filed: Jul. 17, 2023

(65) Prior Publication Data

US 2023/0369837 A1     Nov. 16, 2023

Related U.S. Application Data

(63) Continuation of application No. 17/117,941, filed on Dec. 10, 2020, now Pat. No. 11,721,960, which is a continuation of application No. 16/141,179, filed on Sep. 25, 2018, now Pat. No. 10,879,684, which is a continuation of application No. 15/889,761, filed on Feb. 6, 2018, now Pat. No. 10,084,297, which is a continuation of application No. 15/131,266, filed on Apr. 18, 2016, now Pat. No. 9,887,527.

(60) Provisional application No. 62/149,033, filed on Apr. 17, 2015.

(51) Int. Cl.
*H02G 3/00* (2006.01)
*H02G 3/08* (2006.01)
*H02G 3/10* (2006.01)
*H02G 3/14* (2006.01)
*H02G 3/18* (2006.01)
*H05K 5/02* (2006.01)
*H05K 5/03* (2006.01)

(52) U.S. Cl.
CPC ............. *H02G 3/105* (2013.01); *H02G 3/083* (2013.01); *H02G 3/085* (2013.01); *H02G 3/14* (2013.01); *H02G 3/185* (2013.01); *H05K 5/0226* (2013.01); *H05K 5/03* (2013.01)

(58) Field of Classification Search
CPC ........ H02G 3/105; H02G 3/083; H02G 3/085; H02G 3/14; H02G 3/185; H05K 5/03
See application file for complete search history.

(56) References Cited

U.S. PATENT DOCUMENTS

| | | | |
|---|---|---|---|
| 2,186,903 A | 1/1940 | Gleason | |
| 3,371,149 A | 2/1968 | Maxted | |
| 3,472,945 A | 10/1969 | Trachtenberg | |
| 4,228,317 A | 10/1980 | Cziment | |

(Continued)

FOREIGN PATENT DOCUMENTS

GB     2 241 389 A     8/1991

*Primary Examiner* — Pete T Lee
(74) *Attorney, Agent, or Firm* — Robinson + Cole LLP

(57) ABSTRACT

A floor box for housing electrical components includes a bottom and a plurality of walls extending from the bottom to at least partially define an interior and to at least partially define a central opening accessible to a user. A top plate having an inner portion at least partially defining a first wiring compartment facing the central opening and a second wiring compartment facing the central opening is connected to at least one of the plurality of walls.

20 Claims, 13 Drawing Sheets

(56) References Cited

U.S. PATENT DOCUMENTS

| | | | |
|---|---|---|---|
| 4,338,484 A | 7/1982 | Littrell | |
| 4,483,355 A | 11/1984 | Yuhara | |
| 4,585,139 A | 4/1986 | Bronson et al. | |
| 4,684,017 A | 8/1987 | Watanabe et al. | |
| 4,721,476 A | 1/1988 | Zeliff et al. | |
| 4,828,299 A | 5/1989 | Poe | |
| 4,928,350 A | 5/1990 | Morgan | |
| 5,179,252 A | 1/1993 | Yang | |
| 5,257,487 A | 11/1993 | Bantz et al. | |
| 5,445,539 A | 8/1995 | Dale | |
| 5,535,437 A | 7/1996 | Karl et al. | |
| 5,686,701 A | 11/1997 | Fukushima et al. | |
| 6,061,983 A | 5/2000 | McCleskey | |
| 6,109,669 A | 8/2000 | Pinkow | |
| 6,145,352 A | 11/2000 | Vickers et al. | |
| 6,265,662 B1 | 7/2001 | Riedy et al. | |
| 6,274,809 B1 | 8/2001 | Pudims et al. | |
| 6,483,031 B2 | 11/2002 | O'Donnell | |
| 6,530,250 B1 | 3/2003 | Linares et al. | |
| 6,563,297 B1 | 5/2003 | Boswell et al. | |
| 6,564,428 B2 | 5/2003 | Richard et al. | |
| 6,588,624 B1 | 7/2003 | Connors et al. | |
| 6,669,041 B2 | 12/2003 | Almond | |
| 6,719,332 B2 | 4/2004 | Sekulovic | |
| 6,857,538 B2 | 2/2005 | Lin | |
| 6,866,442 B1 | 3/2005 | Petersen | |
| 7,045,706 B1 * | 5/2006 | Lincoln, III | H02G 3/185 174/53 |
| 7,075,005 B1 | 7/2006 | Drane | |
| 7,083,205 B2 | 8/2006 | Hall | |
| 7,301,100 B2 | 11/2007 | Drane et al. | |
| 7,459,632 B2 | 12/2008 | Bowman | |
| 7,579,549 B2 | 8/2009 | Jolly | |
| 7,635,110 B2 | 12/2009 | Galasso et al. | |
| 7,798,540 B1 | 9/2010 | Vitry et al. | |
| 7,851,703 B2 | 12/2010 | Drane | |
| 7,989,710 B2 | 8/2011 | Hansen et al. | |
| 8,119,912 B2 | 2/2012 | Thibault et al. | |
| 8,153,910 B1 | 4/2012 | Penczak | |
| 8,710,367 B2 | 4/2014 | Korcz et al. | |
| 8,759,674 B2 | 6/2014 | Korcz et al. | |
| 8,925,469 B2 | 1/2015 | Bennie et al. | |
| 9,035,201 B2 | 5/2015 | Jones | |
| 9,236,723 B2 | 1/2016 | Scanzillo et al. | |
| 9,362,731 B2 | 6/2016 | Carbone et al. | |
| 9,373,944 B2 | 6/2016 | Scanzillo et al. | |
| 9,899,808 B2 | 2/2018 | Sipe et al. | |
| 2003/0178421 A1 * | 9/2003 | Almond | H02G 3/383 220/3.8 |
| 2006/0027386 A1 * | 2/2006 | Drane | H02G 3/185 174/53 |
| 2008/0054135 A1 | 3/2008 | Galasso et al. | |
| 2009/0159308 A1 | 6/2009 | Thibault et al. | |
| 2010/0051308 A1 | 3/2010 | Hansen et al. | |
| 2010/0072198 A1 | 3/2010 | Roemer et al. | |
| 2010/0206603 A1 | 8/2010 | Drane | |
| 2010/0236023 A1 | 9/2010 | Wang et al. | |
| 2010/0244464 A1 | 9/2010 | Rajagopal et al. | |
| 2010/0300745 A1 | 12/2010 | Boyle et al. | |
| 2011/0049152 A1 | 3/2011 | Raghunathan et al. | |
| 2011/0056743 A1 | 3/2011 | Solan | |
| 2012/0068583 A1 | 3/2012 | Isaacks et al. | |
| 2012/0200211 A1 | 8/2012 | Yanni | |
| 2013/0264108 A1 | 10/2013 | Jones | |
| 2015/0171572 A1 | 6/2015 | Carbone et al. | |

* cited by examiner

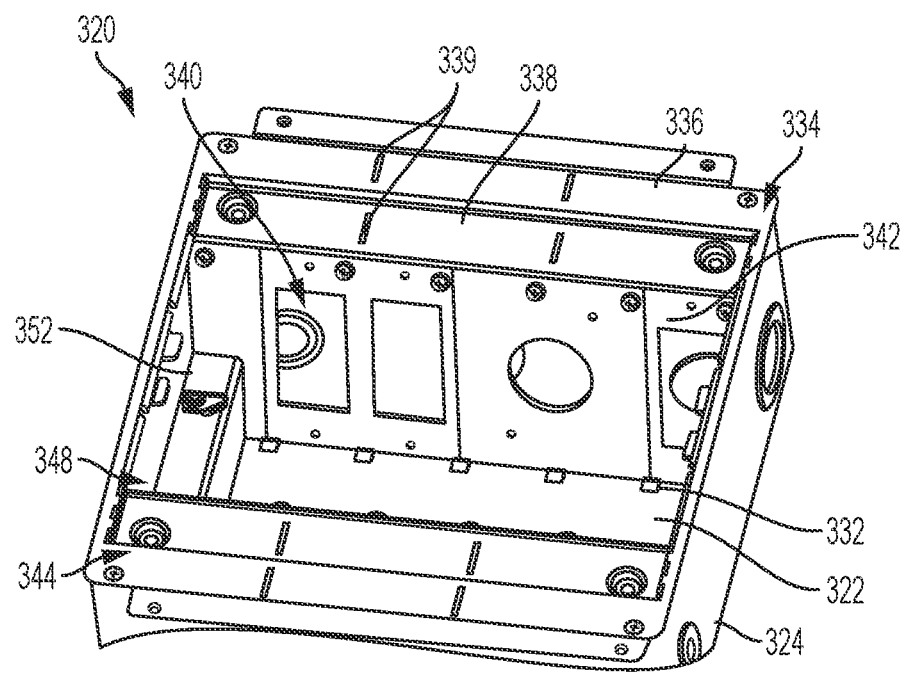
FIG. 14
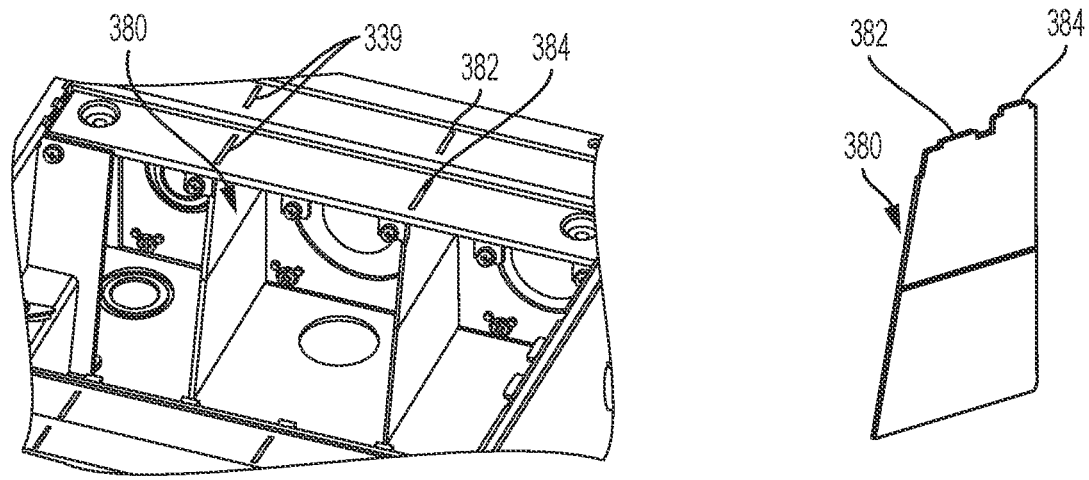
FIG. 15
FIG. 16

FLOOR BOX AND METHOD OF INSTALLING

RELATED APPLICATIONS

This application is a continuation of U.S. application Ser. No. 17/117,941, filed Dec. 10, 2020, which is a continuation of U.S. application Ser. No. 16/141,179, filed Sep. 25, 2018, which is a continuation of U.S. application Ser. No. 15/889,761, filed Feb. 6, 2018, which is a continuation of U.S. application Ser. No. 15/131,266, filed Apr. 18, 2016, which is claims priority to U.S. Provisional Application Ser. No. 62/149,033, filed Apr. 17, 2015, the disclosures of which are incorporated herein by reference in their entirety.

FIELD

Various exemplary embodiments relate to floor boxes, including recessed and raised access floor boxes.

BACKGROUND

Electrical floor boxes are known in the art for housing electrical components such as outlets or receptacle underneath a floor surface. The floor box can include separate compartments for power, data, and communication receptacles. Often the floor box has a hinged cover that pivots from a closed position to an open position. Many floor boxes have a top surface that is raised from the floor creating a lip that interferes with the use of the box.

SUMMARY

According to an exemplary embodiment, a floor box for housing electrical components includes a bottom and a plurality of walls extending from the bottom to at least partially define an interior and to at least partially define a central opening accessible to a user. A top plate having an inner portion at least partially defining a first wiring compartment facing the central opening and a second wiring compartment facing the central opening is connected to at least one of the plurality of walls. A first panel is positioned in front of the first wiring compartment. A second panel is positioned in front of the second wiring compartment. A conductor conduit extends across the central opening between the first compartment and the second compartment.

According to another exemplary embodiment, a floor box for housing electrical components includes a bottom and a plurality of walls extending from the bottom to at least partially define an interior and to at least partially define a central opening accessible to a user. A top plate having an inner portion at least partially defining a first wiring compartment facing the central opening and a second wiring compartment facing the central opening is connected to at least one of the plurality of walls. A first panel is positioned in front of the first wiring compartment. A second panel is positioned in front of the second wiring compartment. A divider is positioned in the interior between the first compartment and the second compartment.

Another exemplary embodiment is directed to a method of installing a floor box. A floor box having a bottom, a plurality of walls extending from the bottom, a top plate connected to at least one of the walls, a first installation cover positioned over the top plate and a second installation cover releasably connected to the first installation is positioned in an open space. The second installation cover is removed from first installation cover. The first installation cover is removed from the floor box.

BRIEF DESCRIPTION OF THE DRAWINGS

The aspects and features of various exemplary embodiments will be more apparent from the description of those exemplary embodiments taken with reference to the accompanying drawings, in which:

The following is a brief description of the drawings in which:

FIG. 14 is a perspective view of the floor box of FIG. 13 with various wiring compartments;

FIG. 15 is a partial, top perspective view of the exemplary wiring compartments of FIG. 14 showing the dividers;

FIG. 16 is perspective view of the divider of FIG. 15;

DETAILED DESCRIPTION OF EXEMPLARY EMBODIMENTS

Figure 1:
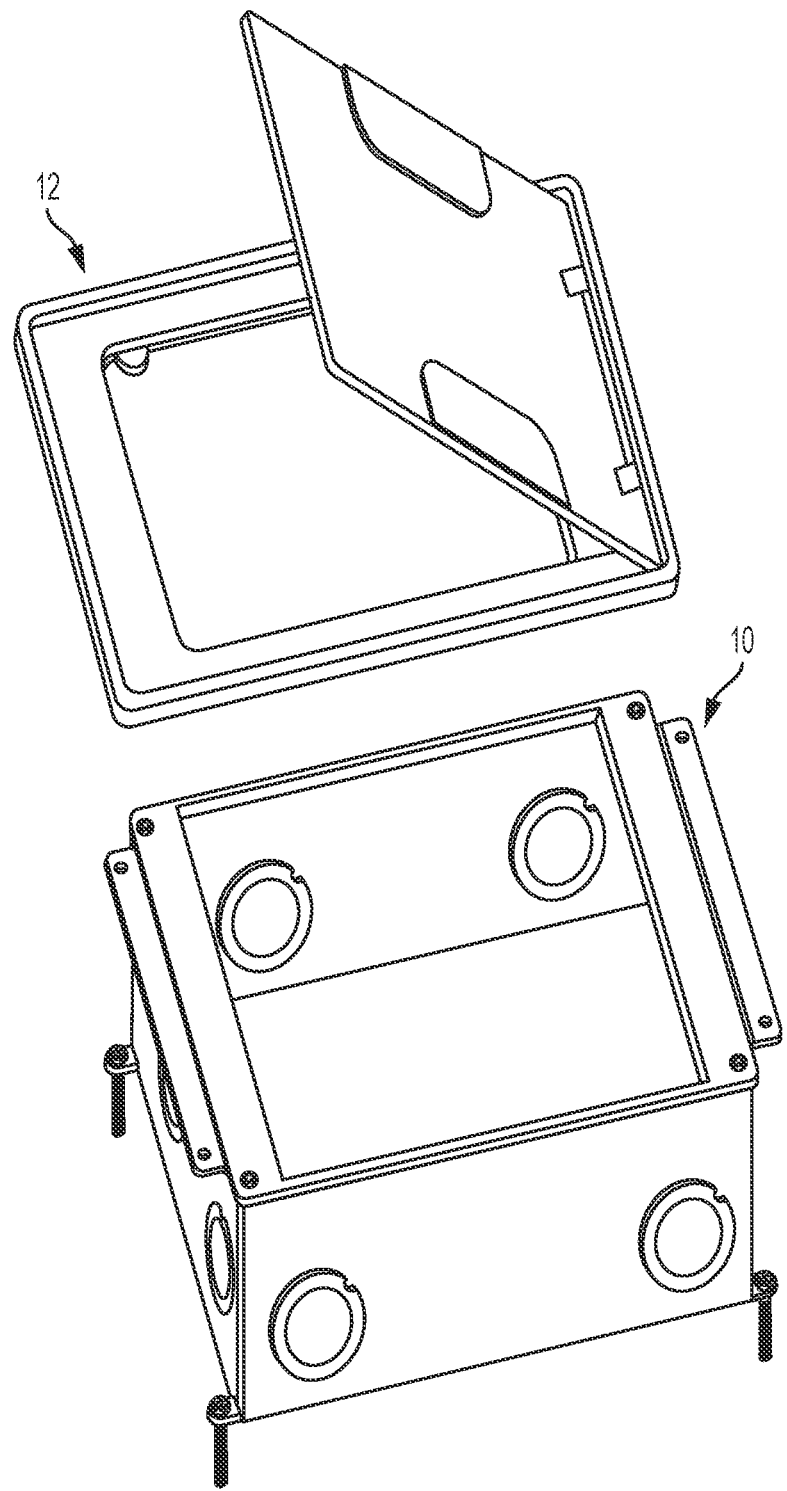
FIG. 1 is an exploded view of an exemplary floor box and cover assembly.

FIG. 1 shows an exemplary embodiment of a floor box 10 and a cover assembly 12 configured to connect to the floor box 10. The floor box 10 is intended to be mounted in the floor of a building and to house one or more electrical components that are accessible to a user through the cover 12. The electrical components can include various wiring devices such as electrical receptacles, video connections, phone connections, data connections, or other power or communication devices. The floor box 10 can have a variety of configurations that includes different sizes and shapes and different internal and external components. The different components can be modular to create different configurations within a single floor box 10. Different covers 12 can also be used with different floor boxes 10. As would be understood by one of ordinary skill in the art, the floor box 10 can be classified by the number of electrical components or gangs that can be placed into the floor box 10.

Figure 2:
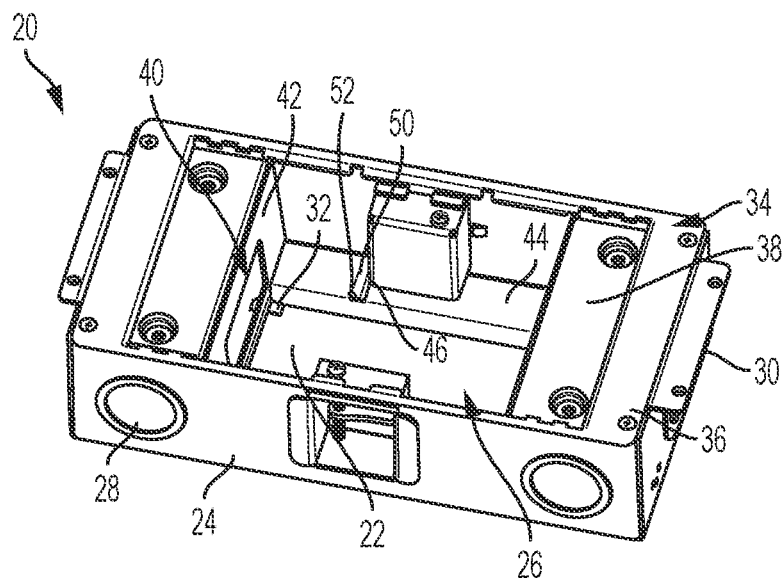
FIG. 2 is a perspective view of an exemplary 2-gang floor box.

FIG. 2 shows an exemplary embodiment of a 2-gang floor box 20 having a bottom 22 and four side walls 24 at least partially defining a central opening 26. The central opening 26 is an area that allows a user to access one or more of the electrical components positioned in the floor box, or for example access electrical components without removing any structural members to connect a device or a load to the electrical components. The side walls 24 extend from the bottom 22 to an upper edge to define a height or depth of the floor box 20 and at least partially define the height of the central opening 26. The side walls 24 and the bottom wall 22 can include one or more knockouts 28 that can be removed to pass conductors into the floor box 20. A mounting flange 30 extends from one or more of the side walls 24. When installing the floor box 20, the mounting flange 30 can be positioned on an adjacent surface and one or more fasteners can extend through the mounting flange 30 and connect to the adjacent surface. The exemplary 2-gang floor box 20 has side walls 24 that are rectangular and oriented at substantially 90 degree angles to one another to give an overall substantially rectangular configuration to the floor box 20. In alternative configurations, the bottom 22 and side walls 24 can have different sizes and shapes, including curvilinear shapes, and have different orientations to change the overall configuration of the floor box 20 to different curvilinear and rectilinear shapes.

One or more protrusions 32 can extend from one or more of the bottom and the side walls. The protrusion 32 can be used to configure different internal components. The protrusions 32 can be integrally formed with the bottom 22 or side walls 24, or they can be formed separately and connected to the bottom 22 or side walls 24 as needed. In the embodiments where the protrusions 32 are separately formed, surface features can be provided in the bottom 22 or side walls 24 to receive the protrusions 32. In an exemplary embodiment, a pair of protrusions 32 are positioned adjacent one another with a slot formed therebetween. The protrusions 32 are shown with an angled or rounded front, a back wall, and a pair of side walls. The back wall and side walls can engage or position different components. Notches can also be formed in the protrusions 32 to receive components. Other sizes, shapes, and configurations of protrusions 32 can also be used.

A top plate 34 is connected to one or more of the side walls 24. The top plate 34 includes an outer portion 36 and one or more inner portions 38. The outer portion 36 has an upper surface that surrounds an upper edge of the side walls 24. The inner portion 38 extends from the outer portion 36 to cover the top of one or more wiring compartments 40 at least partially defined by the top plate 34. In an exemplary embodiment, the inner portion 38 is recessed from the outer portion 36. One or more front panels 42 extends from the inner portion 38 to cover the front of a wiring compartment 40. The front panels 42 can be formed integrally with the top plate 34 or formed separately and connected to the top plate 34, for example through mechanical fasteners such as clips, screws, snap-fits, etc. FIG. 2 shows an exemplary embodiment where the front panels 42 are positioned in the slots formed by the protrusions 32 and extend from the bottom 22 and connected to the inner portion 38 of the top plate by fasteners. With the 2-gang floor box 20 two front panels 42 are used to form two wiring compartments 40.

A conductor conduit 44 extends between the wiring compartments 40 across the central opening 26. The conductor conduit 44 is positioned at an outer edge of the central opening 26 and used to run conductors between the wiring compartments 40 at either end of the floor box 20. In an exemplary embodiment, the conductor conduit 44 is removably attached to the floor box 20 by a fastener, for example a screw.

A removable barrier 46 can be positioned in the conductor conduit 44 to isolate the wiring compartments 40 if desired. For example, the barrier 46 can be used to isolate power conductors or components from communication or data conductors of components. In an exemplary embodiment, the barrier 46 has a substantially L-shaped configuration with a first leg 48 and a second leg 50 extending at an angle to the first leg 48. A tab 52 can extend from the second leg 50. The first leg 48 extends into the conductor conduit 44 and the second leg 50 and the tab 50 extend outside of the conductor conduit 44 to allow a user to insert or remove the barrier 46. In an exemplary embodiment, the tab 52 can extend upward at an angle to the second leg 50 to make it easier for a user to manipulate the barrier 48.

Typical floor boxes run conductors through walls or underneath the central openings to separate the conductors from the central openings. The conductor conduit 44 running through the central opening 26 allows for a larger central opening 26, giving easier access to the electric components positioned in the floor box 20. In an exemplary embodiment, the conductor conduit 44 has a height that is less than the height of the central opening 26. For example the height of the conductor conduit can be less than ⅔, ½, or ¼ of the height of the central opening 26. Alternatively, the top surface of the conductor conduit 44 is positioned at a location beneath the upper edge of the central opening 26, for example at ⅔, ½, or ¼ of the height of the central opening 26.

Figure 3:
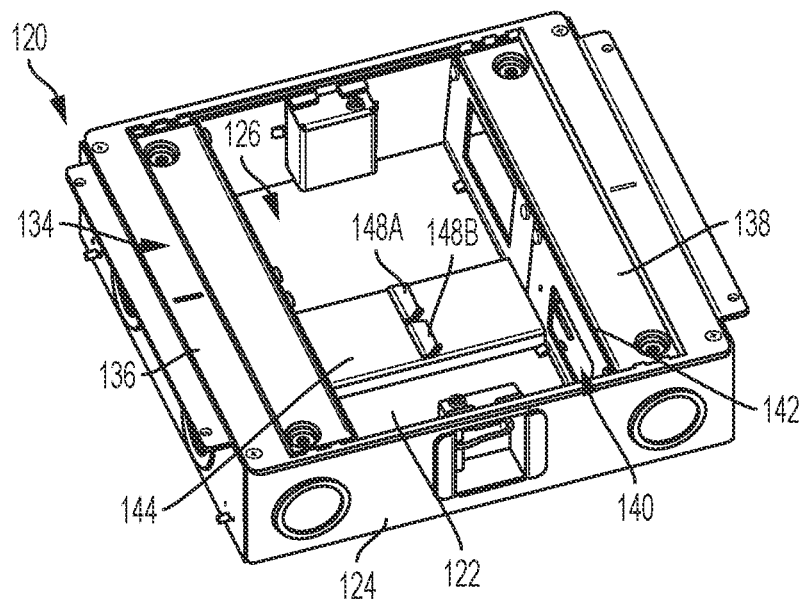
FIG. 3 is a perspective view of an exemplary 4-gang floor box.
Figure 4:
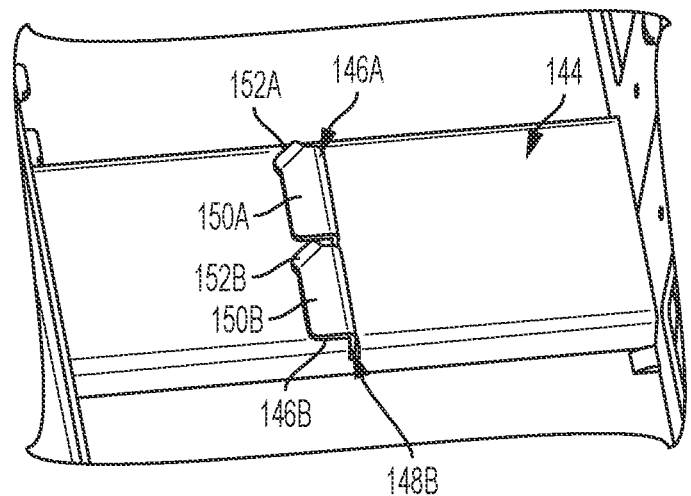
FIG. 4 is a partial, top perspective view of an exemplary conductor conduit in a floor box.
Figure 5:
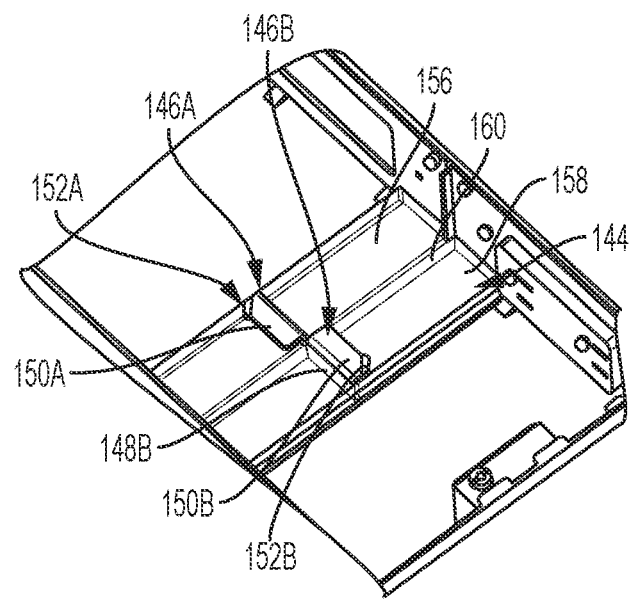
FIG. 5 is a partial, top perspective view of the conductor conduit of FIG. 4 with the conduit transparent.

FIGS. 3-5 shows an exemplary embodiment of a 4-gang floor box 120 having a bottom 122 and four side walls 124 at least partially defining a central opening 126. The exemplary 4-gang floor box 120 has side walls 124 that are rectangular and oriented at substantially 90 degree angles to one another to give an overall substantially rectangular configuration to the floor box 120. In alternative configurations, the bottom 122 and side walls 124 can have different sizes and shapes, including curvilinear shapes, and have different orientations to change the overall configuration of the floor box 120 to different curvilinear and rectilinear shapes.

A top plate 134 is connected to one or more of the side walls 124. The top plate 134 includes an outer portion 136 and one or more inner portions 138. One or more front panels 142 extends from the inner portion 138 to cover the front of one or more wiring compartments 140. The front panels 142 can be formed integrally with the top plate 134 or formed separately and connected to the top plate 134, for example through mechanical fasteners such as clips, screws, snap-fits, etc. In this embodiment, four front panels 142 are used to create four wiring compartments 140, with two wiring compartments 140 at each end of the floor box 120. The wiring compartments 140 at each end can be connected or open underneath the top plate 134 or a divider can be positioned therebetween.

The 4-gang floor box 120 includes a dual-path conductor conduit 144 that extends through the middle of the central opening 126 between the first and second set of wiring compartments 140. As best shown in FIGS. 4 and 5 the dual-path conductor conduit 144 includes a first channel 156 and a second channel 158 that are separated by an interior wall 160. First and second barriers 146A, 146B are respectively positioned in the first and second channels 156, 158. The first and second channels 156, 158 provide separate paths to isolate different conductors, for example data, communication, or power conductors.

Figure 6:
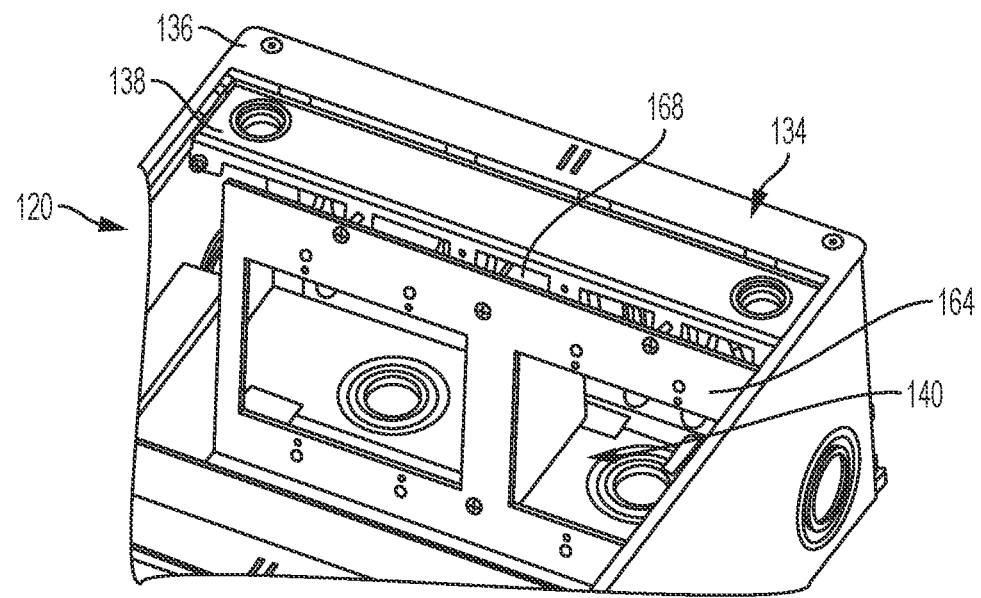
FIG. 6 is an assembly view of an exemplary 4-gang floor box with an exemplary divider and faceplate.
Figure 7:
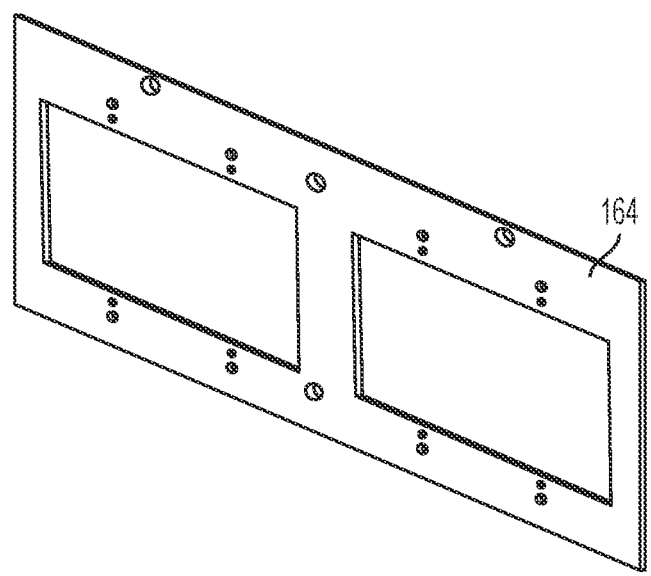
FIG. 7 is a perspective view of the faceplate of FIG. 6.
Figure 8:
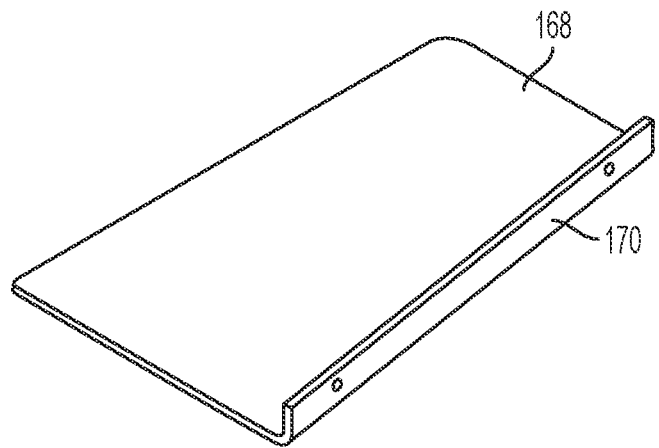
FIG. 8 is a perspective view of the divider of FIG. 6.
Figure 9:
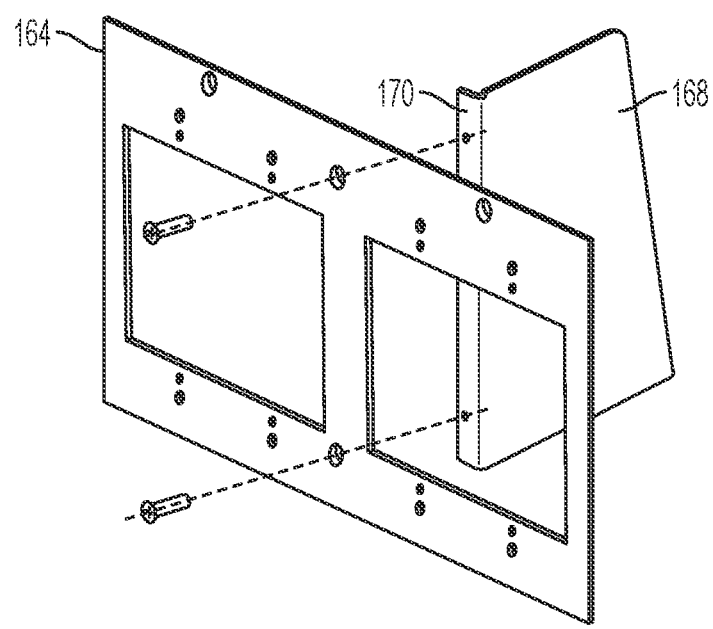
FIG. 9 is an assembly view of the divider and faceplate of FIGS. 6-8.

FIG. 6 shows an exemplary embodiment of a 4-gang floor box 120 that uses a single front plate 164 for a pair of wiring compartments 140. In an exemplary embodiment, the front plate 164 conforms to a NEMA standard to receive one or more NEMA standard outlets, such as a power or data outlet. The floor box 120 includes a top plate 134 connected to one or more of the side walls 124. The top plate 134 includes an outer portion 136 and one or more inner portions 138. One or more mounting flanges 166 extend from the inner portion 138. A divider 168 can be positioned under the top plate 134 to separate the wiring compartments 140. As shown in FIG. 8, the divider 168 includes a flange 170 with one or more openings to mount the divider 168 to the front panel 164.

As shown in FIGS. 6-9, the front plate 164 includes a plurality of openings to receive screws or other mechanical fasteners. Some of the openings align with the mounting flanges 166 to connect the front panel 164 to the top plate 134, a pair of openings align with the openings in the divider 168 to receive fasteners that connect the front plate 164 to the divider 168, and other openings are positioned to connect to standard electrical components.

Figure 10:
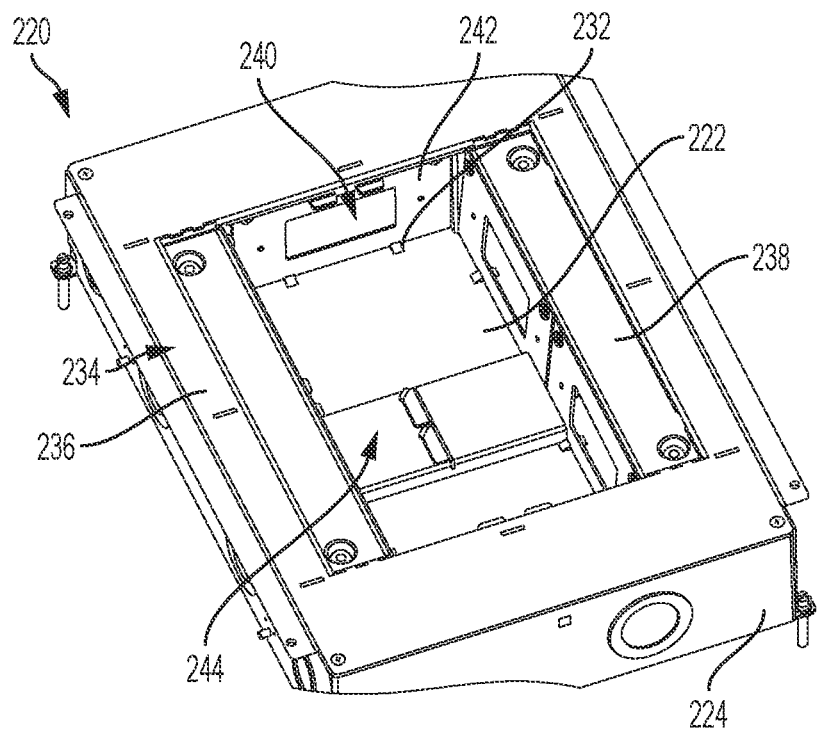
FIG. 10 is a perspective view of an exemplary 6-gang floor box.

FIG. 10 shows an exemplary embodiment of a 6-gang floor box 220 having a bottom 222 and four side walls 224 at least partially defining a central opening 226. The exemplary 6-gang floor box 220 has side walls 224 that are rectangular and oriented at substantially 90 degree angles to one another to give an overall substantially rectangular configuration to the floor box 220. In alternative configurations, the bottom 222 and side walls 224 can have different sizes and shapes, including curvilinear shapes, and have different orientations to change the overall configuration of the floor box 220 to different curvilinear and rectilinear shapes.

One or more protrusions 232 extend from the bottom to position and retain internal components. A top plate 234 is connected to one or more of the side walls 224. The top plate 234 includes an outer portion 236 and one or more inner portions 238. One or more front panels 242 extends from the inner portion 238 to cover the front of one or more wiring compartments 240. The front panels 242 can be formed integrally with the top plate 234 or formed separately and connected to the top plate 234, for example through mechanical fasteners such as clips, screws, snap-fits, etc. In this embodiment, six front panels 242 are used to create six wiring compartments 240, with two wiring compartments 240 at each end of the floor box 220 and two wiring compartments 240 along each side of the floor box 220. The wiring compartments 240 along the sides can be connected or open underneath the top plate 234 or a divider can be positioned therebetween. The 6-gang floor box 220 includes a dual-path conductor conduit 244 that extends through the middle of the central opening 226 between the first and second set of wiring compartments 240.

Figure 11:
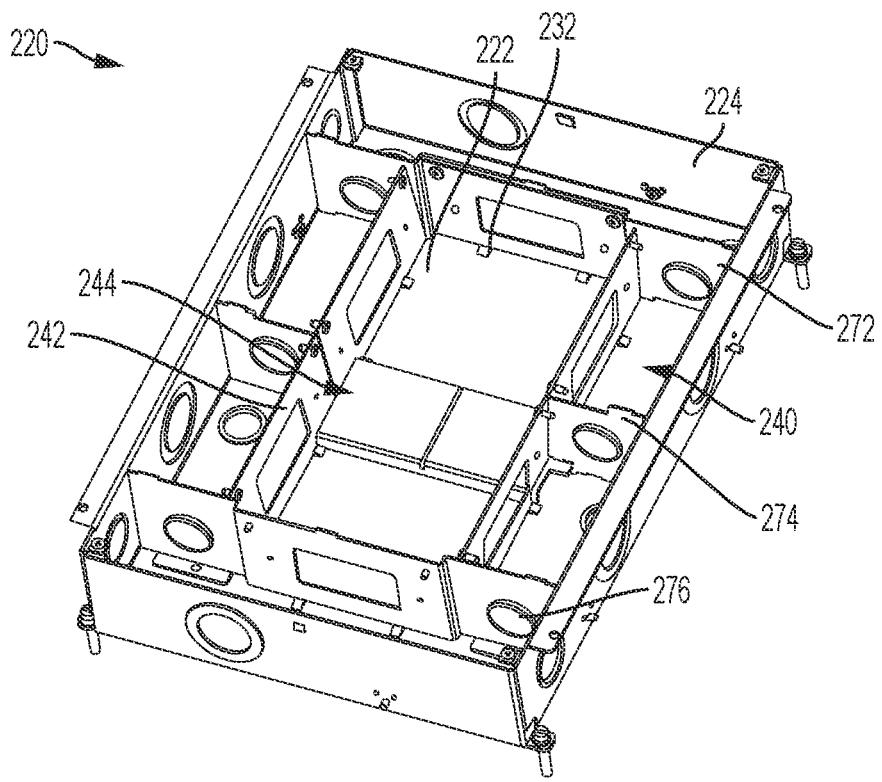
FIG. 11 is a perspective view of the 6-gang floor box of FIG. 10 with the top plate removed.
Figure 12:
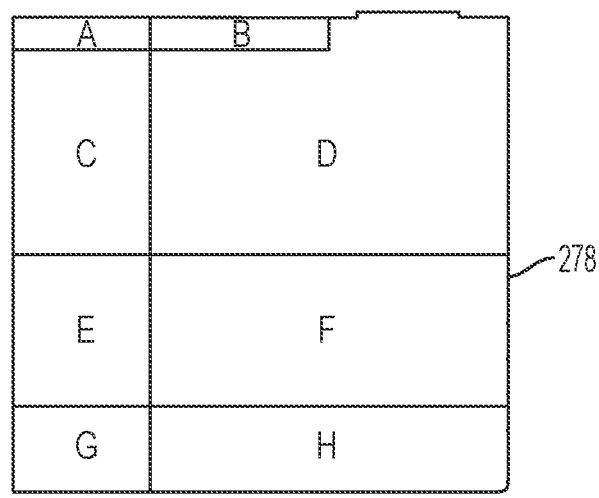
FIG. 12 is a front view of an exemplary adjustable divider.

FIG. 11 shows the 6-gang floor box 220 with the top plate 234 removed. The floor box 220 includes a plurality of divider plates 272 that separate the wiring compartments 240. The divider plates 272 are removably positioned between different wiring compartments 140 as needed by a series of slots, grooves, projections, fasteners, or any combination thereof. An upward extending tab 274 is used to connect the dividers 272 to the top plate 234. For example, the tab 274 can engage a slot formed in the top plate 234 or a protrusion extending from the top plate. One or more knockouts or removable plugs 276 are provided in the divider plates 272 to allow conductors to be selectively run in between wiring compartments. FIG. 12 shows an alternative embodiment of a divider plate 278 that includes breakaway regions A-H. The configuration of the divider 278 can be altered depending on the floor box or the configuration of the wiring compartment as needed. For example, regions A, C, E, and G can be removed to create a narrower divider, or regions F and H can be removed to connect adjacent wiring compartments. The regions A-H can be separated by a frangible connection, for example a score line or perforations.

Figure 13:
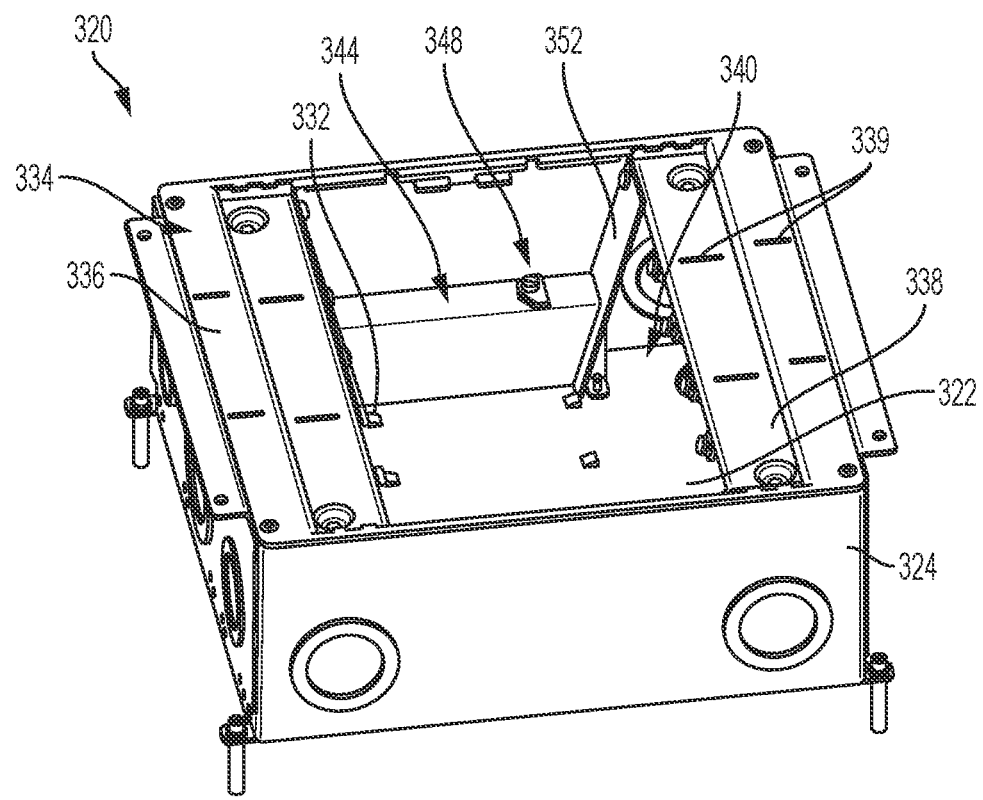
FIG. 13 is a perspective view of an exemplary 8 to 10-gang floor box.

FIGS. 13 and 14 show an exemplary embodiment of a floor box 320 that can be configured as an 8-gang to a 10-gang floor box having a bottom 322 and four side walls 324 at least partially defining a central opening 326. The exemplary 10-gang floor box 220 has side walls 324 that are rectangular and oriented at substantially 90 degree angles to one another to give an overall substantially rectangular configuration to the floor box 320. In alternative configurations, the bottom 322 and side walls 324 can have different sizes and shapes, including curvilinear shapes, and have different orientations to change the overall configuration of the floor box 320 to different curvilinear and rectilinear shapes.

One or more protrusions 332 extend from the bottom to position and retain internal components. A top plate 334 is connected to one or more of the side walls 324. The top plate 334 includes an outer portion 336 and one or more inner portions 338. One or more slots 339 are formed in the outer portion 336 and the inner portion 338. One or more front panels 342 extends from the inner portion 338 to cover the front of one or more wiring compartments 340. The front panels 342 can be formed integrally with the top plate 334 or formed separately and connected to the top plate 334, for example through mechanical fasteners such as clips, screws, snap-fits, etc. In this embodiment, eight to ten front panels 342 are used to create eight to ten wiring compartments 340, with four or five wiring compartments 340 along each side of the floor box 320. A conductor conduit 344 can run along one or both ends of the floor box 32o. A removable barrier 346 is inserted into the conductor conduit 344 and secured by a mechanical fastener. The conductor conduit 344 can extend through a side flange 352 that extends from the top plate 334. The side flange 352 is shown connected to the top plate 334 with a screw, although other mechanical fasteners can be used or the side flange 352 can be formed integrally with the top plate 334.

The wiring compartments 340 along the sides can be connected or open underneath the top plate 334 or a divider 380 can be positioned therebetween. FIGS. 15 and 16 show an exemplary embodiment of a divider 380 having a first tab 382 and a second tab 384. The first and second tabs 382, 384 extend into the slots 339 in the top plate 334. The dividers 380 can therefore be placed or removed to isolate separate wiring compartments 340 as needed. In an alternative embodiment, the divider 380 has a single tab 382. Instead of slots 339, the divider 380 and/or the tabs 382, 384 can be placed into other removable connecting features, for example in a space between two protrusions. The divider 380 can also be held in place by slots formed in the side wall 324. In another alternative embodiment, the bottom of the divider 380 is placed between two protrusions on the bottom of the floor box and the first tab 382 is between two protrusions extending from the top plate. A frangible connection, for example a score line or perforations, is provided so that a user may adjust the size of the divider 380. Although shown used with the 8-gang to a 10-gang floor box, the divider 380 can be adapted for use with any of the floor boxes described herein.

Figure 17:
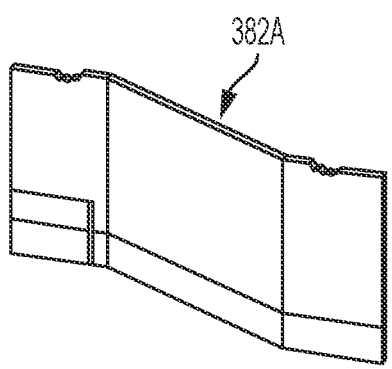
FIG. 17 is a perspective view of another exemplary divider.
Figure 18:
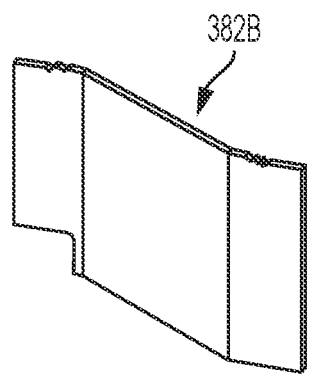
FIG. 18 is a perspective view of another exemplary divider.
Figure 19:
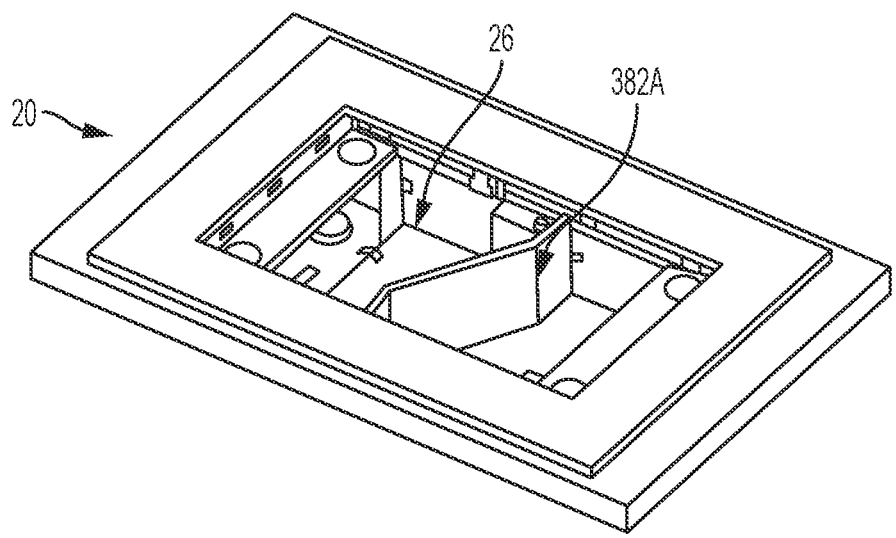
FIG. 19 is a perspective view of the divider of FIG. 17 used in a 2-gang floor box.
Figure 20:
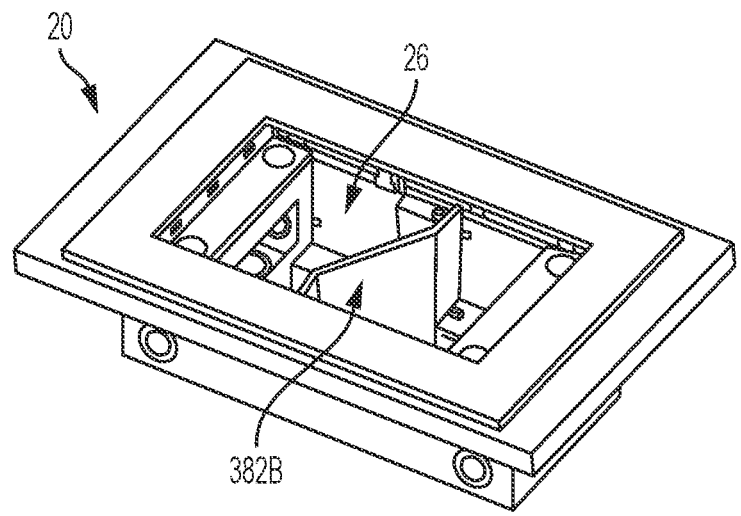
FIG. 20 is a perspective view of the divider of FIG. 18 used in a 2-gang floor box.

FIGS. 17 and 18 show exemplary dividers 382A, 382B that can be used to separate the central opening of a floor box. The dividers 382A, 382B can include different breakaway regions created by a frangible connection, for example a score line or perforations. The breakaway regions allow a user to adjust the configuration of the dividers 382A, 382B for use in different floor boxes and in different applications. FIGS. 19 and 20 show the dividers used in an exemplary 2-gang floor box 20 to separate the central opening 26 into a first portion and a second portion.

Figure 21:
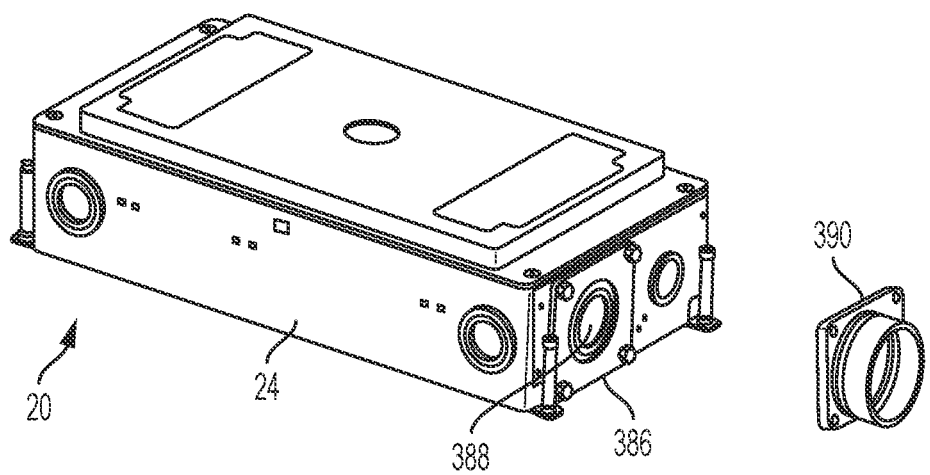
FIG. 21 is perspective view of an exemplary 2-gang floor box with an exemplary knock plate and optional conduit.

FIG. 21 shows the 2-gang floor box 20 having an exemplary knock-out plate 386. The knock-out plate 386 is removably connected to a side wall 24, for example through one or more fasteners. The knock out plate 386 includes a knock out 388 that can be selectively removed. If desired, the knock out plate 386 can be removed and replaced with a hub 390, for example a 2 inch threaded hub. The hub 390 can use the same apertures as used for the knock out plate 386. In an exemplary embodiment, the knock out 388 in the knock-out plate 386 has a diameter less than the conduit in the hub 390, for example 1.25 inches. The number and location of knock out plates 386 can vary as needed for different installation type.

Figure 22:
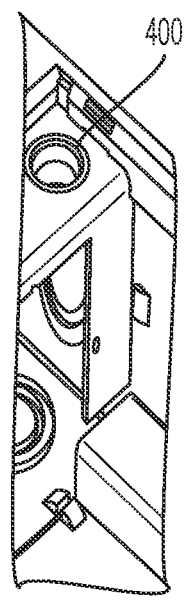
FIG. 22 is a partial perspective view of a floor box having a top plate with a can for receiving an exemplary leveler.
Figure 23:
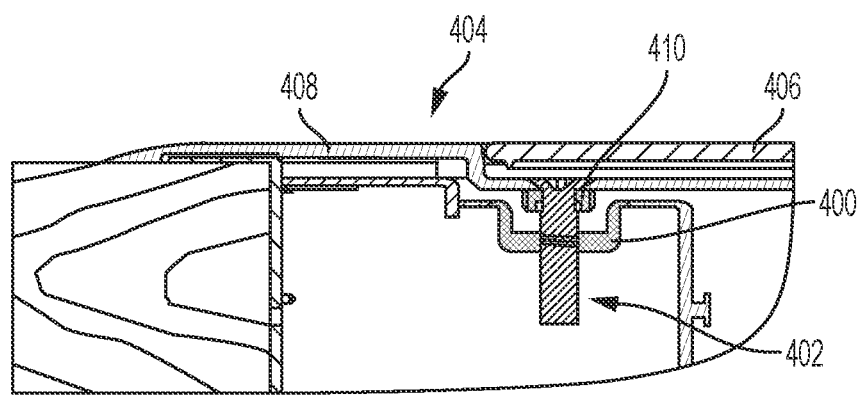
FIG. 23 is a sectional view of an exemplary floor box, leveler, and cover assembly.

As best shown in FIGS. 22 and 23, a floor box can include one or more cans 400 for holding a leveler, for example a jack screw 402. The jack screw 402 helps adjustably position a lid assembly 404. The lid assembly can include a cover 406 and a flange 408. The jack screw 402 includes a support element 410, for example a nut or washer that is attached to the jack screw 402. The jack screw 402 threadably engages the can 400 so that a user can rotate and adjust the height of the jack screw 402 and thereby position the lid assembly 404 relative to the floor box. The can 400 has a counter bore sized to receive the jack screw 402 and support element 410. In an exemplary embodiment the can 400 has a diameter at least twice the diameter of the jack screw 402. The can 400 and jack screw 402 can be incorporated into any of the floor box assemblies discussed herein.

Figure 24:
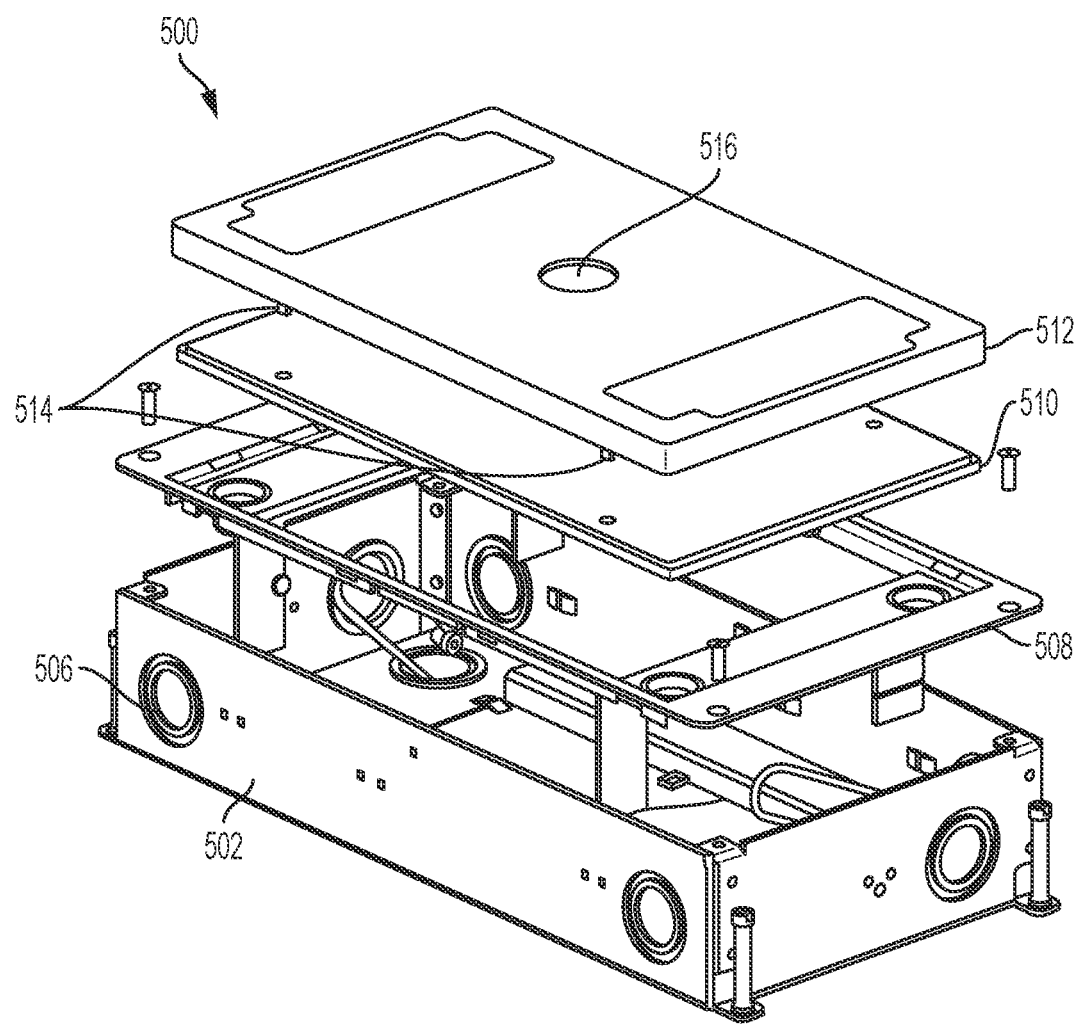
FIG. 24 is a perspective, exploded view of an exemplary 2-gang floor box with exemplary first and second covers.

Various exemplary embodiments are related to components and accessories for installing floor boxes. Floor boxes can be installed in any surface, including carpet, tile, raised access flooring, and concrete. FIG. 24 shows another exemplary 2-gang floor box 500 having four walls 502 surrounding a central opening 504. The walls 502 can include one or more knockouts 506 that can be removed to pass wires into the floor box 500. A top plate 508 is connected to one or more of the walls 502.

The floor box 500 can also include a first cover 510 and a second cover 512. The first and second covers 510, 512 can be used during various installations of the floor box 500. In an exemplary embodiment, the first cover 510 is a metallic cover and the second cover 512 is a non-metallic temporary cover, for example made from a polymer material, although other materials can be used. The second cover 512 is releasably connected to the first cover 510, for example through a snap fit connection. The second cover 512 can include one or more snap fit connectors, for example snap fit bosses 514 extending from the bottom of the second cover 512 that insert into openings on the first cover 510. The bosses can include one or more cantilever beams and/or barbs to assist in retaining the second cover 512 to the first cover 510. After the floor box 500 has been set in the floor, for example after a concrete pour, the second cover 512 can be broken off or otherwise removed from the first cover 510. The concrete can be poured up to and over a portion of the second cover 512. The first and second covers 510, 512 prevents concrete, or other flooring material, from getting into the floor box during installation.

One or more knock outs or openings 516 can be positioned in the second cover to allow for easy removal of the second cover 512 from the first cover 510. A knockout or opening can also be positioned in the first cover 510 to allow the first cover 510 to be easily removed after installation. Depending on the size of the floor box, more than one knock outs or openings 516 can be used. For example, 6 and 10-gang floor boxes can utilize two knock outs or openings 516.

Figure 25:
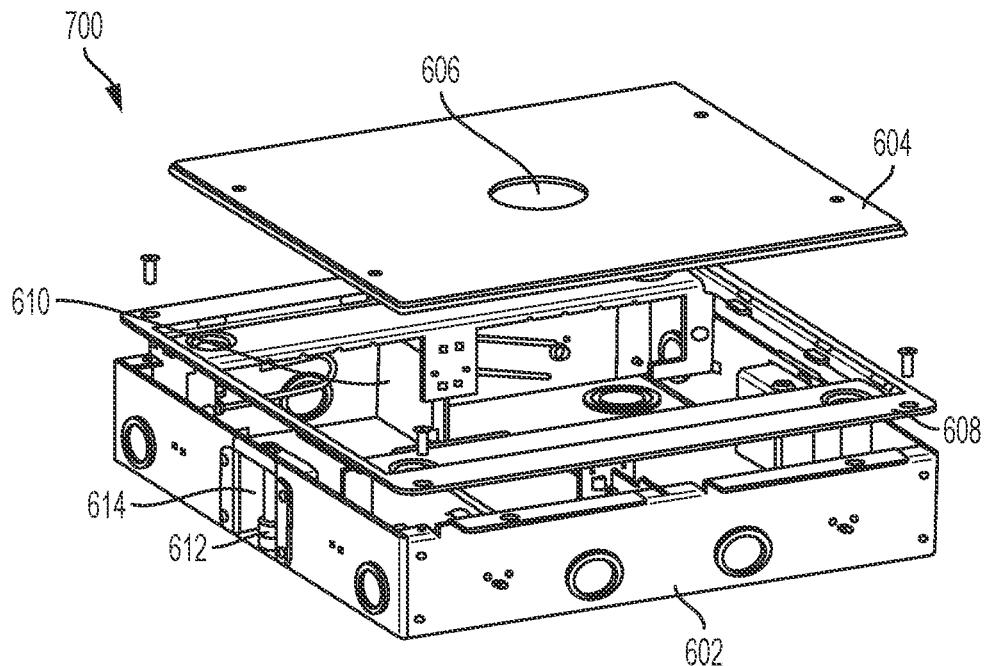
FIG. 25 is a perspective, exploded view of an exemplary 4-gang floor box with a first cover.
Figure 26:
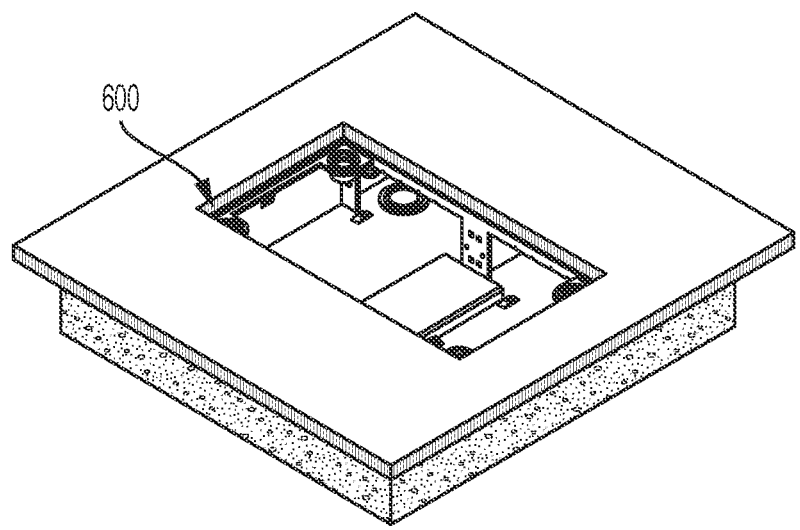
FIG. 26 is a perspective view of an exemplary 4-gang floor box in a carpet installation.

FIG. 25 shows another exemplary embodiment of a 4-gang floor box boo having a plurality of side walls 602. The floor box includes a cover 604 with a knock out 606 to assist in removing the cover 602 after installation. In an exemplary embodiment the cover 604 is metallic. A removable top plate 608 is connected to the side walls 602 and removable dividers 610 are selectively positioned to separate wiring compartments. FIG. 26 shows the 4-gang floor box boo installed in a carpeted floor.

The foregoing detailed description of the certain exemplary embodiments has been provided for the purpose of explaining the general principles and practical application, thereby enabling others skilled in the art to understand the disclosure for various embodiments and with various modifications as are suited to the particular use contemplated. This description is not necessarily intended to be exhaustive or to limit the disclosure to the exemplary embodiments disclosed. Any of the embodiments and/or elements disclosed herein may be combined with one another to form various additional embodiments not specifically disclosed. Accordingly, additional embodiments are possible and are intended to be encompassed within this specification and the scope of the appended claims. The specification describes specific examples to accomplish a more general goal that may be accomplished in another way.

As used in this application, the terms "front," "rear," "upper," "lower," "upwardly," "downwardly," and other orientational descriptors are intended to facilitate the description of the exemplary embodiments of the present application, and are not intended to limit the structure of the exemplary embodiments of the present application to any particular position or orientation. Terms of degree, such as "substantially" or "approximately" are understood by those of ordinary skill to refer to reasonable ranges outside of the given value, for example, general tolerances associated with manufacturing, assembly, and use of the described embodiments.

What is claimed:

1. A floor box for housing electrical components comprising:
   a bottom wall having a first knockout and a second knockout;

a plurality of walls extending from the bottom wall to at least partially define
an interior and to at least partially define a central opening accessible to a user;
a top plate connected to at least one of the plurality of walls;
a first wiring compartment facing the central opening;
a second wiring compartment facing the central opening opposite the first wiring compartment;
a third wiring compartment facing the central opening opposite the first wiring compartment and positioned adjacent to the second wiring compartment;
a first panel positioned in front of the first wiring compartment;
a second panel positioned in front of the second wiring compartment; and
a third panel positioned in front of the third wiring compartment,
wherein the first knockout provides selective access to the second wiring compartment and the second knockout provides selective access to the third wiring compartment.

2. The floor box of claim 1, further comprising a divider plate connectable to the top plate, wherein the divider plate includes a first region and a second region separated from the first region by a frangible connection.

3. The floor box of claim 2, wherein the first region has a first volume and the second region has a second volume less than the first volume.

4. The floor box of claim 2, wherein the top plate includes a slot and the divider plate includes a tab configured to be positioned in the slot.

5. The floor box of claim 2, wherein the divider plate is positioned between the second wiring compartment and the third wiring compartment.

6. The floor box of claim 1, wherein at least one of the plurality of walls includes a third knockout and a fourth knockout.

7. The floor box of claim 6, wherein the third knockout provides selective access to the second wiring compartment and the fourth knockout provides selective access to the third wiring compartment.

8. The floor box of claim 1, wherein the top plate includes a can and a leveler received in the can to adjust the position of a cover assembly.

9. The floor box of claim 8, wherein the leveler is threadably connected to the can and includes a support element.

10. A floor box for housing electrical components comprising:
a bottom wall;
a plurality of walls extending from the bottom wall to at least partially define an interior and to at least partially define a central opening accessible to a user;
a top plate connected to at least one of the plurality of walls;
a first wiring compartment facing the central opening;
a second wiring compartment facing the central opening; and
a divider positioned between the first wiring compartment and the second wiring compartment, wherein the divider includes a first region and a second region separated from the first region by a frangible connection.

11. The floor box of claim 10, wherein the first and second compartments are adjacent and the divider is connected to the top plate.

12. The floor box of claim 10, wherein the top plate includes a slot and the divider includes a tab inserted in the slot.

13. The floor box of claim 10, wherein the divider includes a first tab and a second tab.

14. The floor box of claim 10, wherein the frangible connection includes a score line.

15. The floor box of claim 10, wherein the first region has a first volume and the second region has a second volume less than the first volume.

16. The floor box of claim 10, wherein the divider separates the central opening into a first portion and a second portion.

17. The floor box of claim 16, wherein the divider includes a first section, a second section extending at an oblique angle to the first section, and a third section extending at an oblique angle to the second section.

18. A floor box for housing electrical components comprising:
a bottom wall;
a plurality of walls extending from the bottom wall to at least partially define
an interior and to at least partially define a central opening accessible to a user;
a top plate connected to at least one of the plurality of walls;
a first wiring compartment facing the central opening;
a second wiring compartment facing the central opening opposite the first wiring compartment;
a third wiring compartment facing the central opening opposite the first wiring compartment and positioned adjacent to the second wiring compartment;
a first panel positioned in front of the first wiring compartment;
a second panel positioned in front of the second wiring compartment;
a third panel positioned in front of the third wiring compartment; and
a divider positioned between the second wiring compartment and the third wiring compartment, the divider plate having a knockout to provide selective communication between the second wiring compartment and the third wiring compartment.

19. The floor box of claim 18, wherein the top plate includes a slot and the divider includes a tab inserted in the slot.

20. The floor box of claim 18, wherein the divider is removably positioned between the second wiring compartment and the third wiring compartment.

* * * * *